(12) United States Patent
Shin et al.

(10) Patent No.: US 10,866,473 B2
(45) Date of Patent: Dec. 15, 2020

(54) DISPLAY DEVICE

(71) Applicant: Samsung Display Co., Ltd., Yongin-si (KR)

(72) Inventors: Donghee Shin, Asan-si (KR); Choong-ho Noh, Cheonan-si (KR); Hyungjin Song, Hwaseong-si (KR); Jinyoung Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/360,503

(22) Filed: Mar. 21, 2019

(65) Prior Publication Data
US 2019/0310509 A1    Oct. 10, 2019

(30) Foreign Application Priority Data
Apr. 6, 2018    (KR) .................. 10-2018-0040156

(51) Int. Cl.
*G02F 1/1345*    (2006.01)
*G02F 1/1333*    (2006.01)
(Continued)

(52) U.S. Cl.
CPC ...... *G02F 1/13458* (2013.01); *G02F 1/13452* (2013.01); *G02F 1/133345* (2013.01);
(Continued)

(58) Field of Classification Search
CPC .... G09G 3/006; G09G 3/3648; G09G 3/3275; G09G 3/3677; G09G 3/3291;
(Continued)

(56) References Cited

U.S. PATENT DOCUMENTS 9,063,386 B2    6/2015    Ro et al.
9,772,523 B2    9/2017    Lim
(Continued)

FOREIGN PATENT DOCUMENTS

KR    10-2006-0084201    7/2006
KR    10-2014-0088427    7/2014
KR    10-2016-0124981    10/2016

OTHER PUBLICATIONS

Extended European Search Report dated May 28, 2019, in European Patent Application No. 19167156.9.

*Primary Examiner* — Thoi V Duong
(74) *Attorney, Agent, or Firm* — H. C. Park & Associates, PLC

(57) ABSTRACT

A display device includes a plurality of pixel rows, a first data line, a second data line, a data driver, a first test part, and a second test part. Each of the plurality of pixel rows includes a plurality of pixels. The first data line is disposed between two adjacent pixel rows among the a plurality of pixel rows. The second data line is disposed between the two adjacent pixel rows. The data driver is configured to provide at least one data signal to the first data line and the second data line. The first test part is connected to one of the first data line and the second data line, and is disposed between the plurality of pixel rows and the data driver. The second test part is electrically connected to the other of the first data line and the second data line.

13 Claims, 17 Drawing Sheets

(51) Int. Cl.
*G02F 1/1362* (2006.01)
*H01L 27/12* (2006.01)
*G09G 3/00* (2006.01)
*G09G 3/36* (2006.01)
*H01L 27/32* (2006.01)

(52) U.S. Cl.
CPC ....... *G02F 1/136227* (2013.01); *G09G 3/006* (2013.01); *G09G 3/3648* (2013.01); *H01L 27/12* (2013.01); *H01L 27/124* (2013.01); *H01L 27/1255* (2013.01); *G02F 2001/136254* (2013.01); *G09G 3/3607* (2013.01); *G09G 3/3659* (2013.01); *G09G 2300/0426* (2013.01); *G09G 2330/12* (2013.01); *H01L 27/3276* (2013.01)

(58) Field of Classification Search
CPC .. G09G 3/3696; G09G 3/2074; G09G 3/3607; G09G 3/3611; G09G 3/3659; G09G 2300/0426; G09G 2300/0408; G09G 2300/0809; G09G 2330/12; G09G 2310/0264; G09G 2310/027; G09G 2310/0275; G09G 2310/0281; H01L 27/3276; H01L 27/3262; H01L 27/12; H01L 27/124; H01L 27/3244; H01L 27/3248; H01L 51/0031; H01L 51/5203; H01L 27/1255; G02F 2001/136254; G02F 2001/133388; G02F 1/136; G02F 1/136227; G02F 1/1345; G02F 1/136204; G02F 1/1309; G02F 1/13458; G02F 1/13454; G02F 1/136286; G02F 1/13452; G02F 1/136259; G02F 1/133345; G02F 1/1362; G02F 1/13306; G02F 1/1343; G02F 1/134309; G02F 1/1368; G02F 2203/69

See application file for complete search history.

(56) References Cited

U.S. PATENT DOCUMENTS

2006/0186913 A1   8/2006   Kim
2009/0243972 A1*  10/2009  Her ........................ G09G 3/20
                                                         345/55
2015/0301420 A1   10/2015  Yoshida et al.

\* cited by examiner

DISPLAY DEVICE

CROSS-REFERENCE TO RELATED APPLICATION

This application claims priority from and the benefit of Korean Patent Application No. 10-2018-0040156, filed Apr. 6, 2018, which is hereby incorporated by reference for all purposes as if fully set forth herein.

BACKGROUND

Field

Exemplary embodiments generally relate to display technology, and more particularly, to a display device including a display panel having high definition.

Discussion

The definition of a display device has been improved from full high definition (FHD) providing a definition of 1920× 1080 to ultra-high definition providing an 8K definition (8K) of 7680×4320 or a 4K definition (4K) of 3840×2160. When a display panel constituting the display device is manufactured, various inspection processes for detecting whether a defect of a product is generated are utilized to increase output quality. An open/short (OS) test is one of various inspection methods for inspecting the display panel. The OS test inspects whether a defect is generated on data lines formed on a substrate. The OS test is performed in such a manner that an inspection signal is applied to one side of the data lines, and the inspection signal is detected at the other side of the data lines. While the OS inspection is performed, the inspection signal is applied to each of the data lines using a probe of an inspection equipment; however, since a distance between the data lines is extremely narrowed in a high definition display panels, the application of the inspection signal using the probe is becoming difficult.

The above information disclosed in this section is only for understanding the background of the inventive concepts, and, therefore, may contain information that does not form prior art.

SUMMARY

Some exemplary embodiments provide a display device having a structure capable of testing whether a defect is generated on data lines of a display panel having high definition.

Additional aspects will be set forth in the detailed description which follows, and, in part, will be apparent from the disclosure, or may be learned by practice of the inventive concepts.

According to some exemplary embodiments, a display device includes a plurality of pixels, a plurality of data lines, a data driver, a plurality of first test parts, and a plurality of second test parts. Each of the plurality of pixels includes a transistor. The transistor includes an input electrode, an output electrode, and a control electrode disposed in a different layer than the input electrode and the output electrode. The plurality of data lines includes a plurality of main data lines disposed in a same layer as the input electrode and the output electrode, and a plurality of fan-out data lines disposed in a same layer as the control electrode. The plurality of fan-out data lines are respectively electrically connected to first ends of the plurality of main data lines through contact holes. The data driver is electrically connected to the plurality of fan-out data lines and configured to provide a data signal to the plurality of data lines. The plurality of first test parts are disposed in the same layer as the plurality of main data lines and disposed between the plurality of pixels and the data driver. The plurality of first test parts are electrically connected to one group of data lines among a first group of data lines and a second group of data lines. The first group of data lines includes odd-numbered data lines among the plurality of data lines. The second group of data lines includes even-numbered data lines among the plurality of data lines. The plurality of second test parts extend from respective second ends of those main data lines of those data lines of the other group of data lines among the first group of data lines and the second group of data lines.

According to some exemplary embodiments, a display device includes a plurality of pixel rows, a first data line, a second data line, a data driver, a first test part, and a second test part. Each of the plurality of pixel rows includes a plurality of pixels. The first data line is disposed between two adjacent pixel rows of the plurality of pixel rows. The second data line is disposed between the two adjacent pixel rows. The data driver is configured to provide at least one data signal to the first data line and the second data line. The first test part is connected to one of the first data line and the second data line. The first test part is disposed between the plurality of pixel rows and the data driver. The second test part is electrically connected to the other of the first data line and the second data line. The plurality of pixel rows are disposed between the first test part and the second test part.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
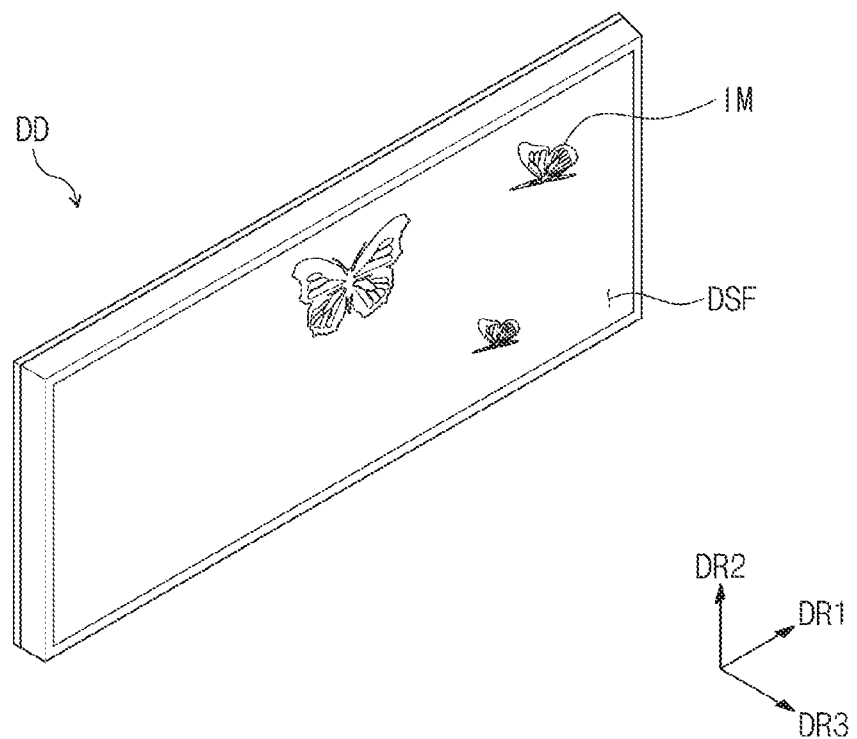
FIG. 1 is a perspective view illustrating a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

In the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2A:
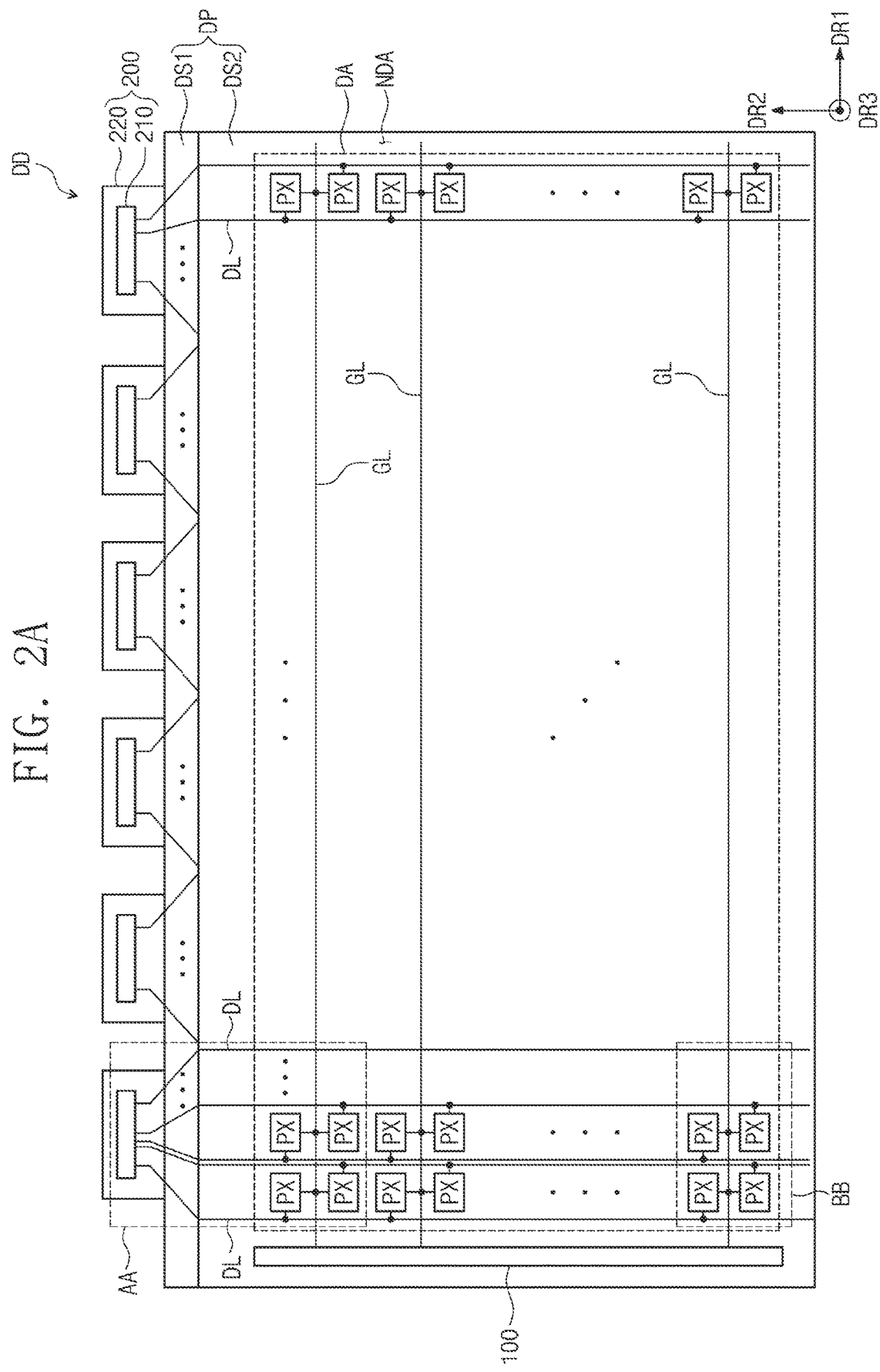
FIG. 2A is a block diagram illustrating the display device in FIG. 1 according to some exemplary embodiments.
Figure 2B:
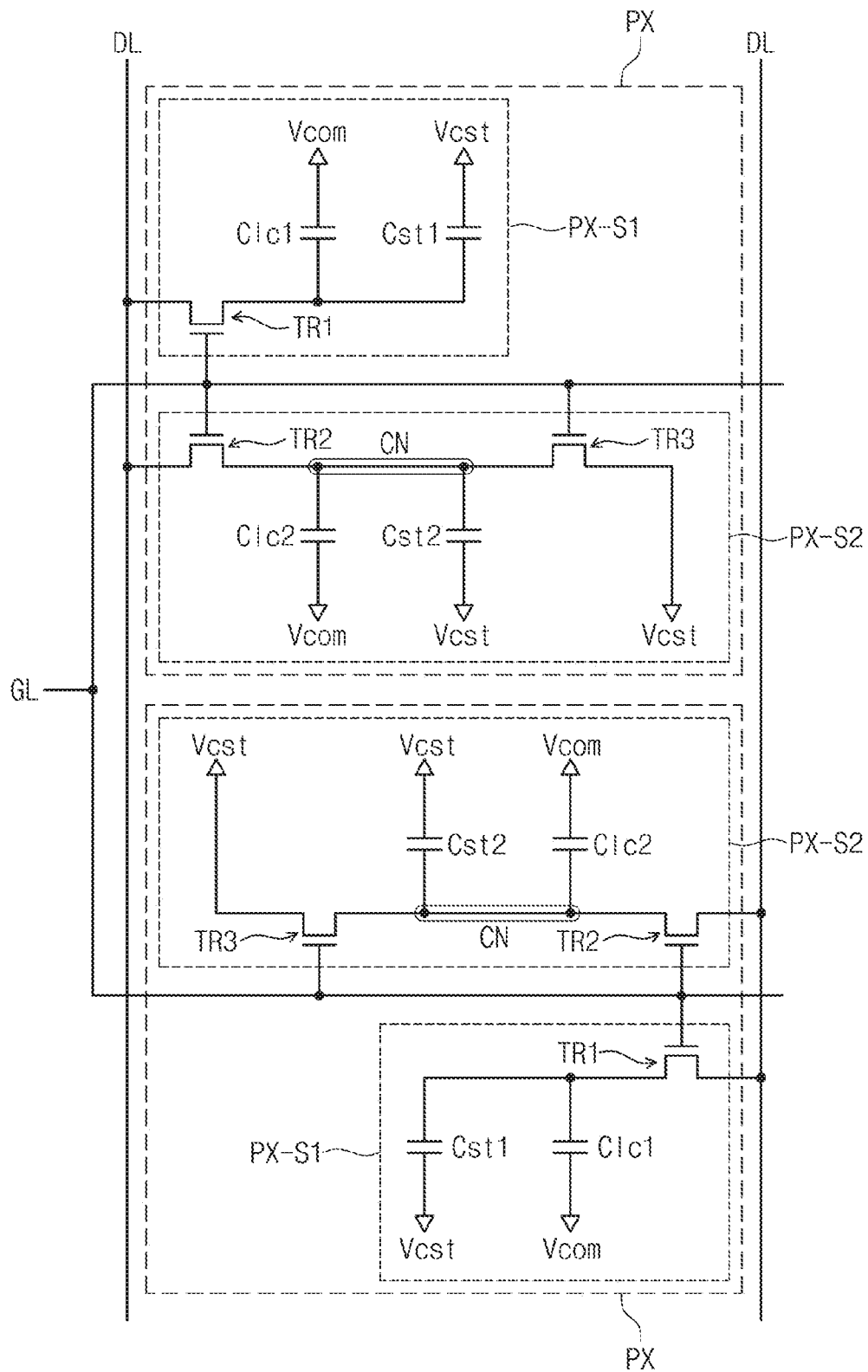
FIG. 2B is an equivalent circuit diagram illustrating pixels in FIG. 2A according to some exemplary embodiments.
Figure 3A:
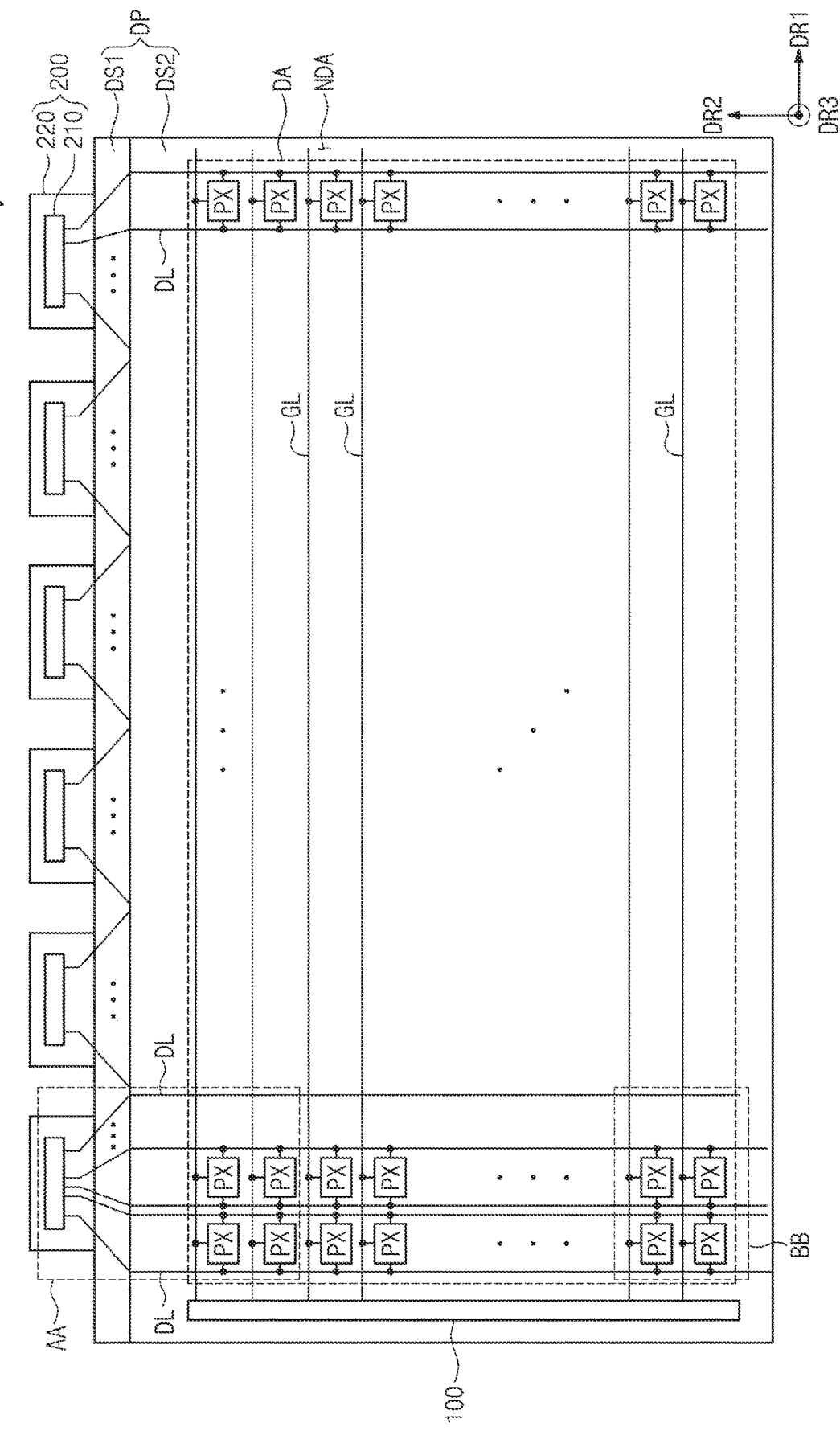
FIG. 3A is a block diagram illustrating the display device in FIG. 1 according to some exemplary embodiments.
Figure 3B:
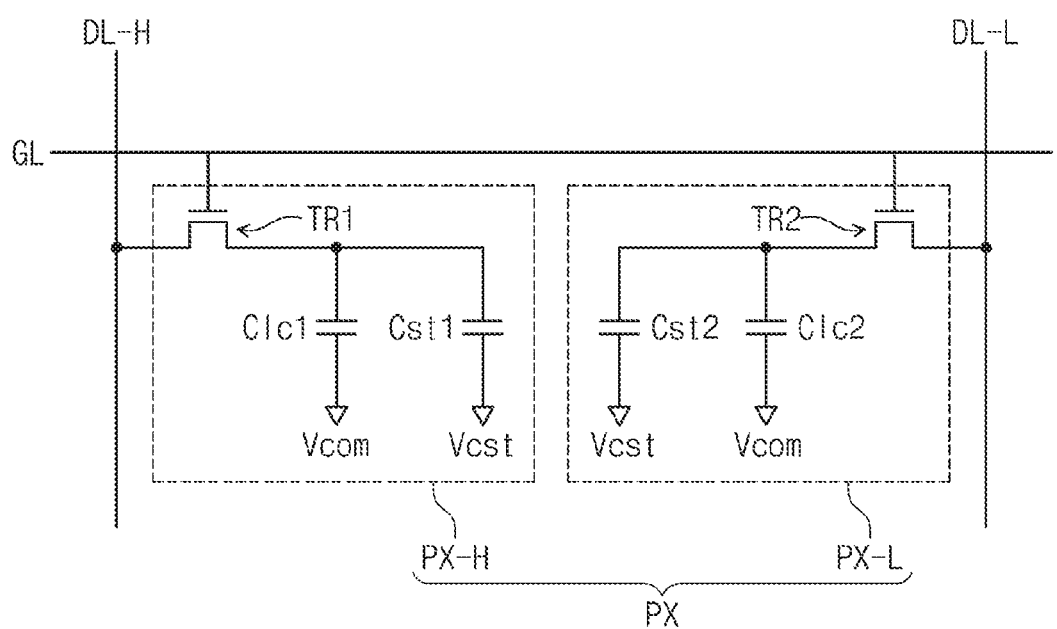
FIG. 3B is an equivalent circuit diagram illustrating pixels in FIG. 3A according to some exemplary embodiments.
Figure 4:
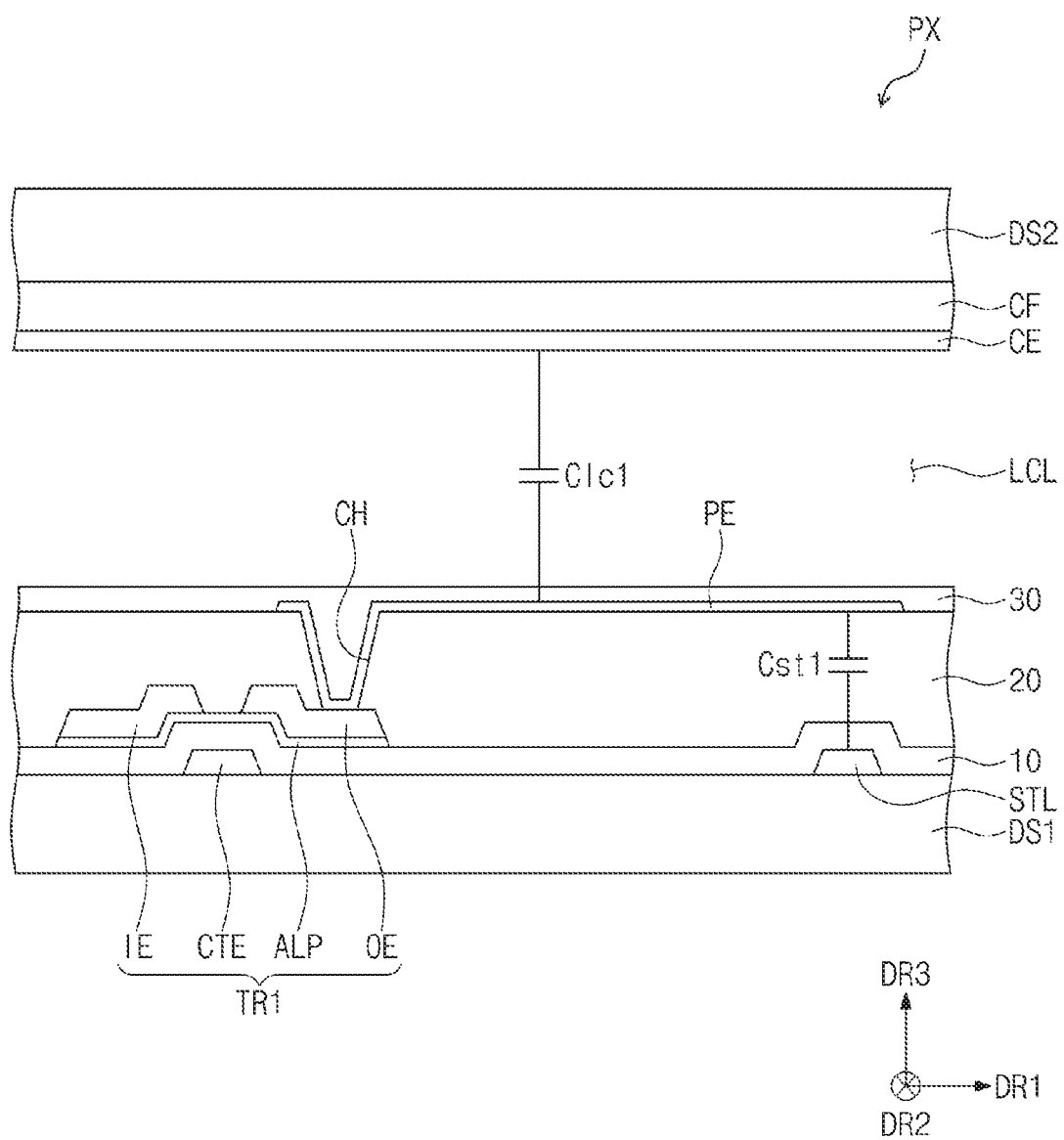
FIG. 4 is a cross-sectional view illustrating a portion of components of the pixels in FIG. 3A according to some exemplary embodiments.

Hereinafter, various exemplary embodiments will be explained in detail with reference to the accompanying drawings FIG. 1 is a perspective view illustrating a display device according to some exemplary embodiments. FIG. 2A is a block diagram illustrating the display device in FIG. 1 according to some exemplary embodiments. FIG. 2B is an equivalent circuit diagram illustrating pixels in FIG. 2A according to some exemplary embodiments. FIG. 3A is a block diagram illustrating the display device in FIG. 1 according to some exemplary embodiments. FIG. 3B is an equivalent circuit diagram illustrating pixels in FIG. 3A according to some exemplary embodiments. FIG. 4 is a cross-sectional view illustrating a portion of components of the pixels in FIG. 3 according to some exemplary embodiments.

Referring to FIG. 1, a display device DD provides an image IM to a user through a display surface DSF. Although a butterfly is illustrated as an example of the image IM, exemplary embodiments are not limited thereto. The display surface DSF may be parallel to a plane defined by a first direction DR1 and a second direction DR2. A third direction DR3 is perpendicular to each of the first direction DR1 and the second direction DR2

As illustrated in FIG. 2A or 3A, the display device DD according to some exemplary embodiments includes a display panel DP, a gate driving circuit 100, and a data driving circuit 200.

Exemplary embodiments are not limited to a particular type of the display panel DP. For example, the display panel DP may include at least one of various types of display panels, such as a liquid crystal display panel, an organic light emitting display panel, an electrophoretic display panel, and an electrowetting display panel. For descriptive and illustrative purposes, the display panel DP will be described as a liquid crystal display panel. The liquid crystal display device including the liquid crystal display panel may further include at least one of a polarizing member (not shown) and a backlight unit (not shown).

The display panel DP includes a first substrate DS1, a second substrate DS2 spaced apart from the first substrate DS1, and a liquid crystal layer LCL disposed between the first substrate DS1 and the second substrate DS2. On a plane (or in a plan view), the display panel DP includes a display area DA on which a plurality of pixels PX are arranged and a non-display area NDA outside (e.g., surrounding) the display area DA. The display surface DSF in FIG. 1 may correspond to the display area DA.

The display panel DP includes a plurality of gate lines GL disposed on the first substrate DS1 and a plurality of data lines DL crossing the gate lines GL, and insulated from the gates lines GL. The plurality of gate lines GL are connected to the gate driving circuit 100. The plurality of data lines DL are connected to the data driving circuit 200. FIG. 2A only illustrates a portion of the plurality of gate lines GL and only a portion of the plurality of data lines DL. Although not shown, the display panel DP may further include a dummy gate line disposed on (or in) the non-display area NDA of the first substrate DS1.

FIG. 2A only illustrates a portion of the plurality of pixels PX. The plurality of pixels PX are connected to corresponding gate lines of the plurality of gate lines GL and corresponding data lines of the plurality of data lines DL, respectively.

The plurality of pixels PX may display one of primary colors. The primary colors may include red, green, blue, and white colors. However, exemplary embodiments are not limited thereto. For example, the plurality of pixels PX may display one of mixed colors. The mixed colors may further include various colors, such as yellow, cyan, and magenta.

The gate driving circuit 100 generates gate signals and outputs the generated gate signals to the gate lines GL. Although one gate driving circuit 100 connected to left ends of the plurality of gate lines GL is exemplarily illustrated in FIG. 2A, exemplary embodiments are not limited to the number and arranged position of the gate driving circuit 100.

The data driving circuit 200 generates data signals according to received image data. The data driving circuit 200 outputs the generated data signals to the plurality of data lines DL. For the purpose of this disclosure, the data signal may be referred to as a data voltage.

The data driving circuit 200 may include a data driver 210 and a flexible circuit board 220 on which the data driver 210 is mounted. Each of the data driver 210 and the flexible circuit board 220 may be provided in plurality. The plurality of data drivers 210 provide corresponding data signals to the corresponding data lines of the plurality of data lines DL, respectively.

FIG. 2A illustrates an example of a tape carrier package (TCP) type data driving circuit 200. In some exemplary embodiments, the data driver 210 may be disposed on the non-display area NDA of the first substrate DS1 in a chip on glass (COG) manner.

Referring to FIG. 2A, the pixels PX are arranged in a matrix type and include a plurality of pixel rows and a plurality of pixel columns. The pixels PX included in each of the pixel rows are arranged in the first direction DR1. The pixel rows are arranged in the second direction DR2. The pixels PX included in each of the pixel columns are arranged in the second direction DR2. The pixel columns are arranged in the first direction DR1.

Each of the pixel columns may be connected to two data lines DL. For instance, one of the two data lines DL may be connected to odd-numbered pixels of the pixels PX of the pixel column, and the other of the two data lines DL may be connected to even-numbered pixels. Two adjacent pixel rows of the plurality of pixel rows may be connected to one gate line GL.

As described above, the display device DD may be constituted using the gate lines GL, which are half in number of the pixel rows. Accordingly, time for applying the gate signal may be further secured in comparison with other methods in which the gate lines GL are provided in the same number as the pixel prows. When the time for applying the gate signal is extended, accuracy of the signal applied to the pixel PX may be enhanced as much to stably realize the display panel DP having high definition. In this case, as the number of the data lines DL increases by two times, a distance between the data lines DL decreases. Hereinafter, according to some exemplary embodiments, limitations that are generated as the number of the data lines DL increases may be at least partially resolved.

FIG. 2B exemplarily illustrates two pixels PX that are disposed adjacent to each other of the pixels PX. Referring to FIG. 2B, each of the pixels PX may include a first sub-pixel PX-S1 and as second sub-pixel PX-S2. The first sub-pixel PX-S1 may include a first transistor TR1, a first liquid crystal capacitor Clc1, and a first storage capacitor Cst1. The second sub-pixel PX-S2 may include a second transistor TR2, a third transistor TR3, a second liquid crystal capacitor C1c2, and a second storage capacitor Cst2.

The first transistor TR1 includes a control electrode connected to the gate line GL, an input electrode connected to the data line DL, and an output electrode connected to the first liquid crystal capacitor Clc1 and the first storage capacitor Cst1.

The first liquid crystal capacitor Clc1 includes a first electrode connected to the output electrode of the first transistor TR1 and a second electrode that receives a common voltage Vcom. The first liquid crystal capacitor Clc1 includes a first electrode connected to the output electrode of the first transistor TR1 and a second electrode that receives a storage voltage Vcst.

The second transistor TR2 includes a control electrode connected to the gate line GL, an input electrode connected to the data line DL, and an output electrode connected to the second liquid crystal capacitor C1c2 and the second storage capacitor Cst2.

The third transistor TR3 includes a control electrode connected to the gate line GL, an input electrode that receives the storage voltage Vcst, and an output electrode connected to the output electrode of the second transistor TR2.

The second liquid crystal capacitor C1c2 includes a first electrode connected to the output electrode of the second transistor TR2 and a second electrode that receives the common voltage Vcom. The second storage capacitor Cst2 includes a first electrode connected to the output electrode of the second transistor TR2 and a second electrode that receives the storage voltage Vcst.

The common voltage Vcom and the storage voltage Vcst may have substantially same voltage.

The first to third transistors TR1, TR2, and TR3 are turned-on by the gate signal provided through the gate line GL.

The data voltage of the data line DL is provided to the fist sub-pixel PX-S1 through the turned-on first transistor TR1. A first pixel voltage corresponding to a level difference between the data voltage and the common voltage Vcom that are provided is charged to the first liquid crystal capacitor Clc1. According to an electric charge amount charged to the first liquid crystal capacitor Clc1, orientation of a liquid crystal director included in the liquid crystal layer LCL is varied. According to the orientation of the liquid crystal director, light incident into the liquid crystal layer LCL may be transmitted or blocked. The first storage capacitor Cst1 is connected in parallel to the first liquid crystal capacitor Clc1 to maintain the orientation of the liquid crystal director for a predetermined section.

The data voltage of the data line DL is provided to the second sub-pixel PX-S2 through the turned-on second transistor TR2. Also, the storage voltage Vcst is provided to the second pixel PX2 through the turned-on third transistor TR3.

A voltage (hereinafter, referred to as a distribution voltage) at a contact point node CN, at which the second transistor TR2 is connected to the third transistor TR3, has a value distributed according to a ratio of resistance values of the turned-on second and third transistors TR2 and TR3. That is, the distribution voltage have a value between the data voltage provided through the turned-on second transistor TR2 and the storage voltage Vcst provided through the turned-on third transistor TR3.

Accordingly, a second pixel voltage corresponding to a level difference between the distribution voltage and the common voltage Vcom is charged to the second liquid crystal capacitor C1c2. According to an electric charge amount charged to the second liquid crystal capacitor Clc2, the orientation of the liquid crystal director included in the liquid crystal layer LCL is varied. According to the orientation of the liquid crystal director, light incident into the liquid crystal layer LCL may be transmitted or blocked. The second storage capacitor Cst2 is connected in parallel to the second liquid crystal capacitor Clc2 to maintain the orientation of the liquid crystal director for a predetermined section.

Since the first pixel voltage charged to the first liquid crystal capacitor Clc1 and the second pixel voltage charged to the second liquid crystal capacitor Clc2 are different from each other, a gradation displayed in the first sub-pixel PX-S1 is different from a gradation displayed in the second sub-pixel PX-S2. As described above, images having gradations different from each other are displayed in the first and second sub-pixels PX-S1 and PX-S2 and visibility of the pixel PX may be enhanced.

Although an equivalent circuit diagram of the pixel PX is exemplarily illustrated in FIG. 2B, exemplary embodiments are not limited thereto. In another exemplary embodiment, the storage capacitors Cst1 and Cst2 may be omitted.

Referring to FIG. 3A, each of the pixels PX is connected to the two corresponding data lines DL and the corresponding gate line GL.

Referring to FIG. 3B, each of the pixels PX includes a high-level pixel PX-H and a low-level pixel PX-L. The high-level pixel PX-H may correspond to the first sub-pixel PX-S1 in FIG. 2B, and the low-level pixel PX-L may correspond to a portion of the second sub-pixel PX-S2 in FIG. 2B The high-level pixel PX-H and the low-level pixel PX-L receive a gate signal from the same gate line GL. The high-level pixel PX-H receives data from a high-level data line DL-H of the data lines DL, and the low-level pixel PX-L receives data from the low-level data line DL-L of the data lines DL.

Voltages charged to the liquid crystal capacitor Clc1 of the high-level pixel PX-H and the liquid crystal capacitor Clc2 of the low-level pixel PX-L, respectively, are different from each other, and a gradation displayed in the high-level pixel PX-H and a gradation displayed in the low-level pixel XP-L are different from each other.

As described above, as images having gradations different from each other are displayed in the high-level pixel PX-H and the low-level pixel PX-L, respectively, the visibility of the pixel PX may be enhanced.

FIG. 4 exemplarily illustrates a portion corresponding to the first transistor TR1, the first liquid crystal capacitor Clc1, and the first storage capacitor Cst1 of the components in the pixel of FIG. 3B.

Referring to FIG. 4, the first transistor TR1 includes a control electrode CTE connected to the gate line GL, an activation layer ALP overlapping the control electrode CTE, an input electrode IE connected to the data line DL, and an output electrode OE spaced apart from the input electrode IE.

The first liquid crystal capacitor Clc1 includes a pixel electrode PE and a common electrode CE. The first storage capacitor Cst1 includes the pixel electrode PE and a portion of a storage line STL overlapping the pixel electrode PE.

The gate line GL and the storage line STL are disposed on one surface of the first substrate DS1. The control electrode CTE may be branched from the gate line GL.

A first insulation layer 10 covering the control electrode CTE and the storage line STL is disposed on one surface of the first substrate DS1. The first insulation layer 10 may include at least one of an inorganic material and an organic material. The first insulation layer 10 may be an organic layer or inorganic layer. The first insulation layer 10 may have a multi-layered structure including, e.g., a silicon nitride layer and a silicon oxide layer.

The activation layer ALP overlapping the control electrode CTE is disposed on the first insulation layer 10. The activation layer ALP may include a semiconductor layer (not shown) and an ohmic contact layer (not shown). The activation layer ALP may include amorphous silicon or polysilicon. Alternatively, the activation layer ALP may include a metallic oxide semiconductor.

The output electrode OE and the input electrode IE are disposed on the activation layer ALP. The output electrode OE and the input electrode IE are spaced apart from each other. Each of the output electrode OE and the input electrode IE may partially overlap the control electrode CTE.

Although a structure of the first transistor TR1 is exemplarily illustrated in FIG. 4, exemplary embodiments are not limited thereto. For example, the first transistor TR1 may have a different structure.

A second insulation layer 20 covering the activation layer ALP, the output electrode OE, and the input electrode IE is disposed on the first insulation layer 10. The second insulation layer 20 provides a planar surface. The second insulation layer 20 may include an organic material.

The pixel electrode PE is disposed on the second insulation layer 20. The pixel electrode PE is connected to the output electrode OE through a contact hole CH passing through the second insulation layer 20. An orientation layer 30 covering the pixel electrode PE may be disposed on the second insulation layer 20.

A color filter layer CF is disposed on one surface of the second substrate DS2. The common electrode CE is disposed on the color filter layer CF. The common voltage Vcom is applied to the common electrode CE.

An orientation layer (not shown) covering the common electrode CE may be disposed on the common electrode CE, e.g., the orientation layer may be disposed between the common electrode CE and the liquid crystal layer LCL. Another insulation layer may be disposed between the color filter layer CF and the common electrode CE.

The pixel electrode PE, the common electrode CE, and the liquid crystal layer LCL disposed therebetween may form the first liquid crystal capacitor Clc1. Also, a portion of the pixel electrode PE and the storage line STL that are disposed with the first and second insulation layers 10 and 20 disposed therebetween may form the first storage capacitor Cst1. The storage line STL receives the storage voltage Vcst having a value different from that of the pixel voltage.

Here, a cross-section of the pixel PX in FIG. 4 may be merely one example. For instance, unlike the illustration of FIG. 4, at least one of the color filter layer CF and the common electrode CE may be disposed on the first substrate DS1. That is, a liquid crystal display panel according to some exemplary embodiments may include pixels, such as a vertical alignment (VA) mode pixel, a patterned vertical alignment (PVA) mode pixel, an in-plane switching (IPS) mode pixel, a fringe-field switching (FFS) mode pixel, or a plane-to-line switching (PLS) mode pixel. However, exemplary embodiments are not limited to the aforementioned pixel structures.

Figure 5:
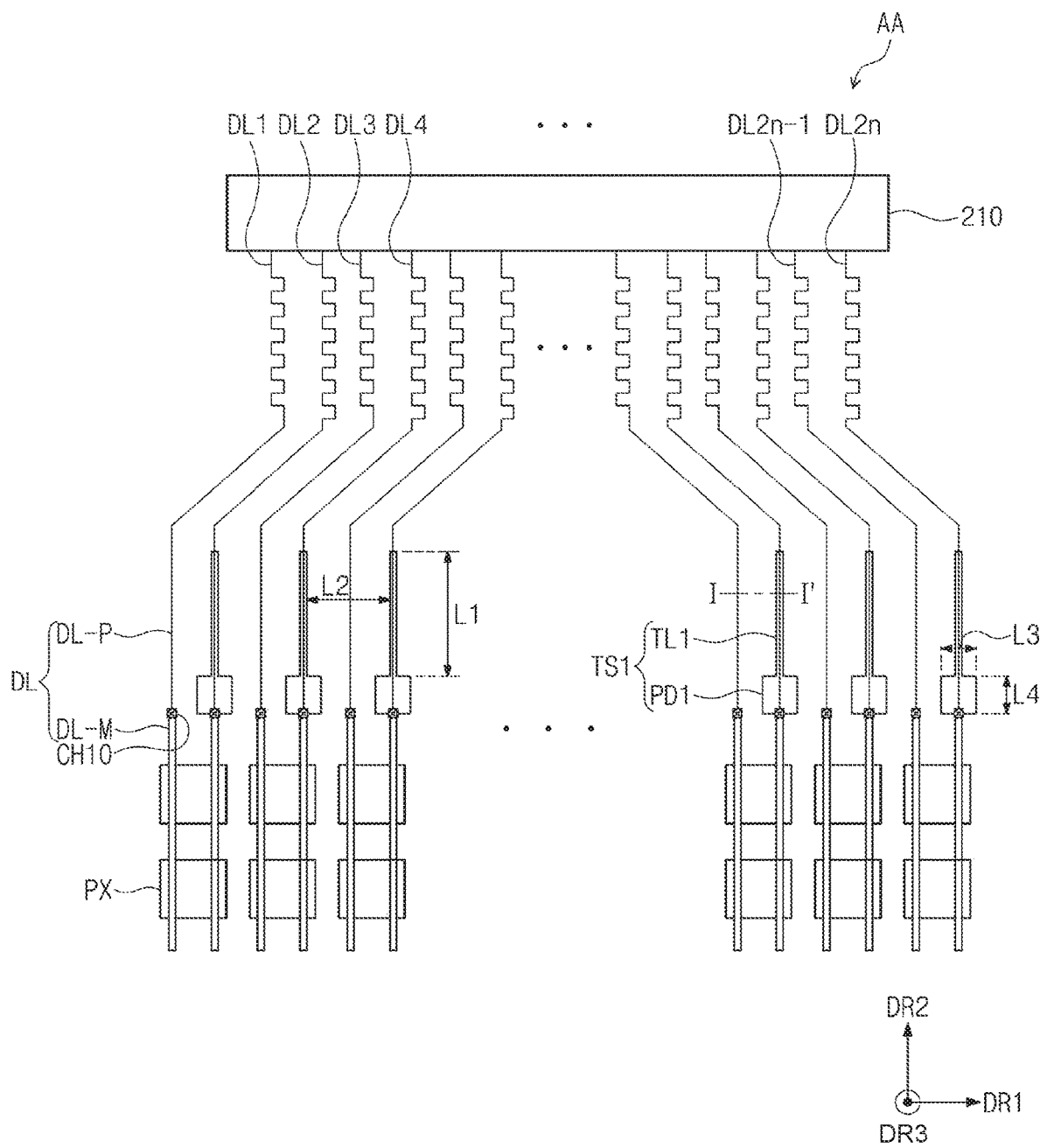
FIG. 5 is an enlarged view illustrating a portion AA in FIG. 2A or 3A according to some exemplary embodiments.
Figure 6:
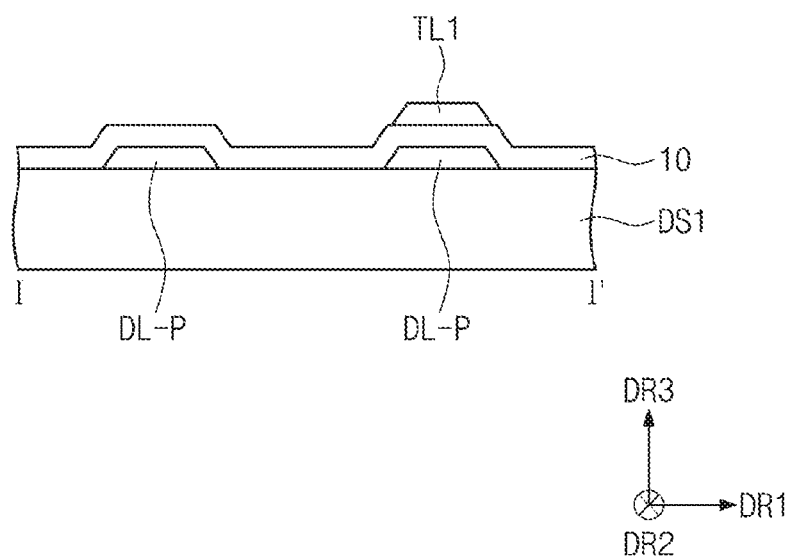
FIG. 6 is a cross-sectional view taken along sectional line in FIG. 5 according to some exemplary embodiments.

FIG. 5 is an enlarged view illustrating a portion AA in FIG. 2A or 3A according to some exemplary embodiments. FIG. 6 is a cross-sectional view taken along sectional line in FIG. 5 according to some exemplary embodiments.

Each of the data lines DL includes a main data line DL-M and a fan-out data line DL-P. In FIG. 5, $2n$ data lines DL1 to DL2$n$ are exemplarily illustrated, where "n" is an integer.

The main data line DL-M is connected to the pixels PX. The main data line DL-M may be disposed on the same layer as the input electrode IE (refer to FIG. 4) and the output electrode OE (refer to FIG. 4) of the first transistor TR1 (refer to FIG. 4). That is, the main data line DL-M may be disposed on the first insulation layer 10 (refer to FIG. 4) such that the first insulation layer 10 is disposed between the main data line DL-M and the first substrate DS1.

The fan-out data line DL-P electrically connects the data driver 210 to the main data line DL-M. The fan-out data line DL-P may be disposed on the same layer as the control electrode CTE (refer to FIG. 4) of the first transistor TR1 (refer to FIG. 4). That is, referring to FIG. 6, the fan-out data line DL-P may be disposed on the first substrate DS1 such that the fan-out data line DL-P is disposed between the first insulating layer 10 and the first substrate DS1.

The fan-out data line DL-P may be connected to the main data line DL-M through a contact hole CH10 defined in the first insulation layer 10.

A portion, which is adjacent to the data driver 210, of the fan-out data lines DL-P may have an uneven shape for equalization of resistance values of the data lines DL having lengths different from each other by the fan-out.

The display device DD according to some exemplary embodiments may include first test parts TS1 that are electrically connected to the even-numbered data lines DL2, DL4, and DL2$n$ of the data lines DL1 to DL2$n$. The first test parts TS1 may be disposed between the pixels PX and the data driver 210 on (or parallel to) the plane defined by the first direction DR1 and the second direction DR2. Each of the first test parts TS1 is a portion for performing an open/short (OS) test, and each of the first test parts TS1 includes a first test line TL1 and a first test pad PD1.

The first test line TL1 is applied with an inspection signal from a probe of first inspection equipment (not shown) when the open/short test is performed. The first test line TL1 extends in the same direction as the main data line DL-M, e.g., the second direction DR2. The first test line TL1 may be disposed on the same layer as the main data line DL-M. That is, referring to FIG. 6, the first test line TL1 may be disposed on the first insulation layer 10 such that the first insulation layer 10 is between the first test line TS1 and the first substrate DS1.

The first test line TL1 may have a length L1 (hereinafter, referred to as a first length) equal to or greater than about 300 µm and equal to or less than about 500 µm, e.g., equal to or greater than about 350 µm and equal to or less than about 450 µm, such as equal to or greater than about 300 µm and equal to or less than about 400 µm, for instance equal to or greater than about 400 µm and equal to or less than about 500 µm. In some exemplary embodiments, the first length L1 may be equal to or greater than about 300 µm and equal to or less than about 350 µm. In some exemplary embodiments, the first length L1 may be equal to or greater than about 450 µm and equal to or less than about 500. When the first length L1 is less than about 300 µm, the probe of the first inspection equipment may be difficult to be aligned. When the first length L1 is greater than about 500 µm, a narrow bezel may be difficult to be realized because the non-display area NDA (refer to FIG. 1) of the display device DD increases.

A distance L2 (hereinafter, referred to as a second distance) between two first test lines TL1, which are adjacent to each other, of the first test lines TL1 may be equal to or greater than about 50 µm and equal to or less than about 100 µm, such as equal to or greater than about 75 µm and equal to or less than about 90 µm, for instance, equal to or greater than about 50 µm and equal to or less than about 80 µm, e.g., equal to or greater than about 60 µm and equal to or less than about 70 µm. When the second distance L2 is less than about 50 µm, two first test lines TL1, which are adjacent to each other, may be short-circuited by the probe of the first inspection equipment. When the second distance L2 is greater than about 100 µm, as the distance between the pixels PX increases, the display panel DP having high definition may be difficult to be realized.

The first test pad PD1 is a portion that is contacted with a probe of second inspection equipment in order to perform an inspection for detecting an exact coordinate of a portion in which a defect is generated when the data line DL is determined to be opened or short-circuited by the first inspection equipment. The first test pad PD1 may be disposed between the pixels PX and the first test line TL1 on the plane defined by the first direction DR1 and the second direction DR2.

The first test pad PD1 extends from the first test line TL1. The first test pad PD1 may have a transverse length L3 (hereinafter, referred to as a third length) and a longitudinal length L4 (hereinafter, referred to as a fourth length), each of which is equal to or greater than about 30 µm and equal to or less than about 60 µm, e.g., equal to or greater than about 40 µm and equal to or less than about 50 µm, such as equal to or greater than about 30 µm and equal to or less than about 45 µm, for instance equal to or greater than about 45 µm and equal to or less than about 60 µm. When each of the third length L3 and the fourth length L4 is less than about 30 µm, the probe of the second inspection equipment may be difficult to contact the first test pad PD1. When each of the third length L3 and the fourth length L4 is greater than about 60 µm, the first test pad PD1 may contact another first test pad PD1, which is adjacent thereto, to cause a defect.

Although the first test pads PD1 are arranged in one row in FIG. 5, exemplary embodiments not limited thereto. In some exemplary embodiments, the first test pads PD1 may be arranged in a plurality of rows.

Figure 7:
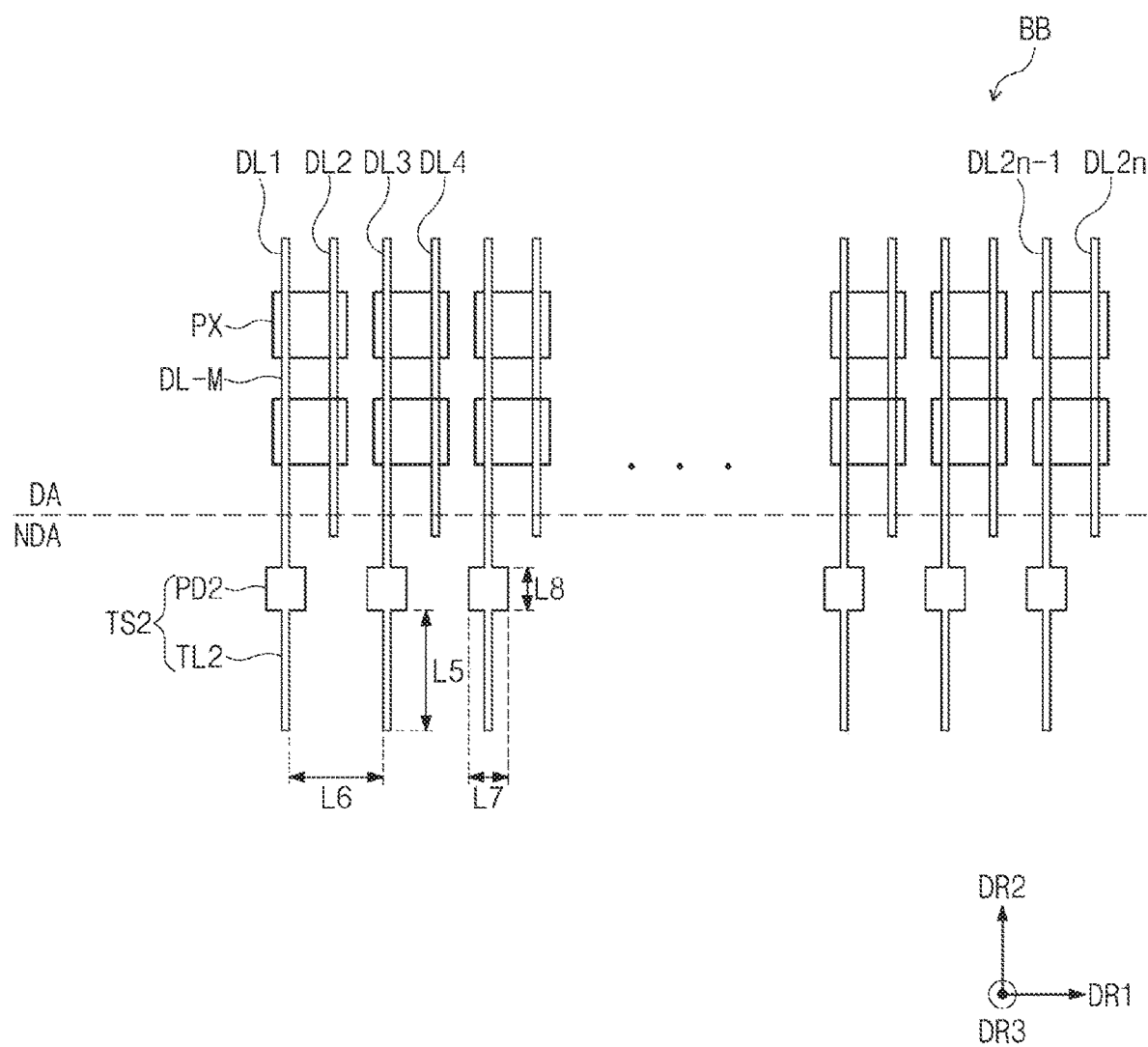
FIG. 7 is an enlarged view illustrating a portion BB in FIG. 2A or 3A according to some exemplary embodiments.

FIG. 7 is an enlarged view illustrating a portion BB in FIG. 2A or 3A according to some exemplary embodiments.

The display device DD according to some exemplary embodiments may include second test parts TS2 that are electrically connected to the odd-numbered data lines DL1, DL3, . . . , and DL2n-1 of the data lines DL1 to DL2n. The pixels PX are disposed between the first test parts TS1 (refer to FIG. 5) and the second test parts TS2 on the plane defined by the first direction DR1 and the second direction DR2.

In some exemplary embodiments, a portion of the even-numbered data lines DL2, DL4, . . . , and DL2n may extend to the non-display area NDA, but may not extend to an area on which the second test parts TS2 are arranged.

For the purposes of this disclosure, the data lines DL, which are connected to the first test parts TS1, of the data lines DL may be referred to as a first group, and the data lines DL, which are connected to the second test parts TS2, may be referred to as a second group.

Each of the second test parts TS2 is a portion for performing an open/short (OS) test like the first test part TS1 (refer to FIG. 5). Each of the second test parts TS2 includes a second test line TL2 and a second test pad PD2.

The second test line TL2 is applied with an inspection signal from the probe of first inspection equipment (not shown) when the open/short test is performed like the first test part TS1 (refer to FIG. 5). The second test line TL2 extends in the same direction as the main data line DL-M, e.g., the second direction DR2. The second test line TL2 may be disposed on the same layer as the main data line DL-M such that the first insulation layer 10 is disposed between the second test line TL2 and the first substrate DS1.

Description regarding a length L5 (hereinafter, referred to as a fifth length) of the second test line TL2 is substantially the same as the description regarding the first length L1, which is described in FIG. 5, and thus, omitted here. Description regarding a distance L6 (hereinafter, referred to as a sixth distance) of two test lines TL2, which are adjacent to each other, of the second test lines TL2 is substantially the same as the description regarding the second distance L2, which is described in FIG. 5, and thus, omitted here.

The second test pad PD2 is a portion that is contacted with the probe of the second inspection equipment in order to perform an inspection for detecting an exact coordinate of a portion in which a defect is generated when the data line DL is determined to be opened or short-circuited by the first inspection equipment. The second test pad PD2 may be disposed between the pixels PX and the second test line TL2 on the plane defined by the first direction DR1 and the second direction DR2.

The second test line TL2 extends from the second test pad PD2. Description regarding a transverse length L7 (hereinafter, referred to as a seventh length) and a longitudinal length L8 (hereinafter, referred to as an eighth length) of the second test pad PD2 is substantially the same as the description regarding the third length L3 and the fourth length L4, and thus, omitted here.

As illustrated in FIGS. 5 to 7, since the first test parts TS1 and the second test parts TS2 are disposed on different positions (or layers) from each other, the second distance L2 and the sixth distance L6 may be secured for using the first inspection equipment, and the third length L3, the fourth length L4, the seventh length L7, and the eighth length L8 may be secured for using the second inspection equipment.

Although the second test pads PD2 are arranged in one row in FIG. 7, exemplary embodiments are not limited thereto. In some exemplary embodiments, the second test pads PD2 may be arranged in a plurality of rows.

Although the first test parts TS1 are connected to the even-numbered data lines, and the second test parts TS2 are connected to the odd-numbered data lines in FIGS. 5 to 7, exemplary embodiments are not limited thereto. In some exemplary embodiments, the first test parts TS1 may be connected to the odd-numbered data lines, and the second test parts TS2 may be connected to the even-numbered data lines.

Figure 8:
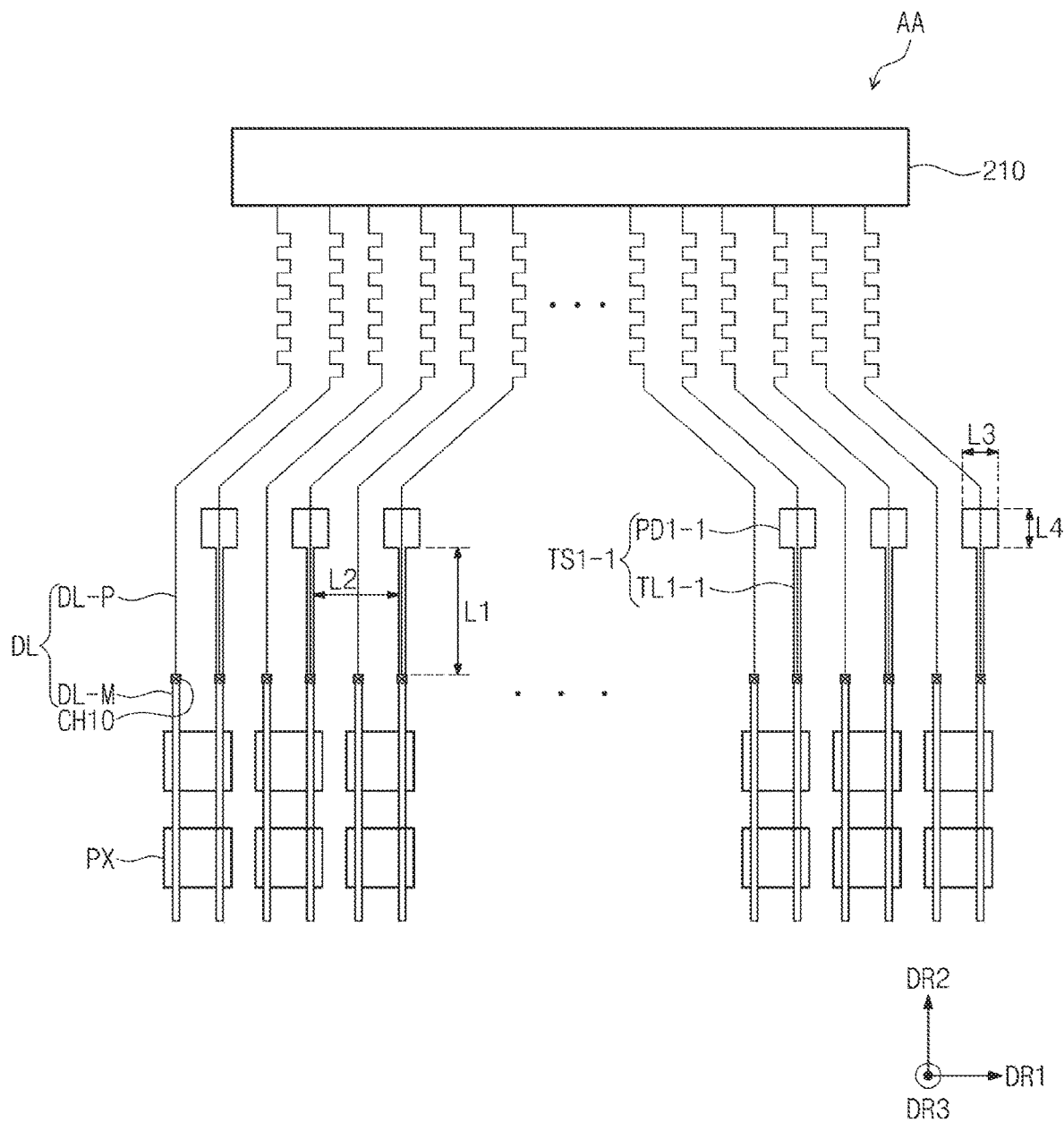
FIG. 8 is an enlarged view illustrating a portion AA in FIG. 2A or 3A according to some exemplary embodiments.

FIG. 8 is an enlarged view illustrating a portion AA in FIG. 2A or 3A according to some exemplary embodiments.

Referring to FIG. 8, each of first test parts TS1-1 includes a first test line TL1-1 and a first test pad PD1-1. The first test line TL1-1 may be disposed between the pixels PX and the first test pad PD1-1 on the plane defined by the first direction DR1 and the second direction DR2. Description regarding other components is substantially the same as that described in FIGS. 5 and 6, and thus, omitted here.

FIGS. 9 to 12 are enlarged views illustrating a portion BB in FIG. 2A or 3A according to some exemplary embodiments.

Figure 9:
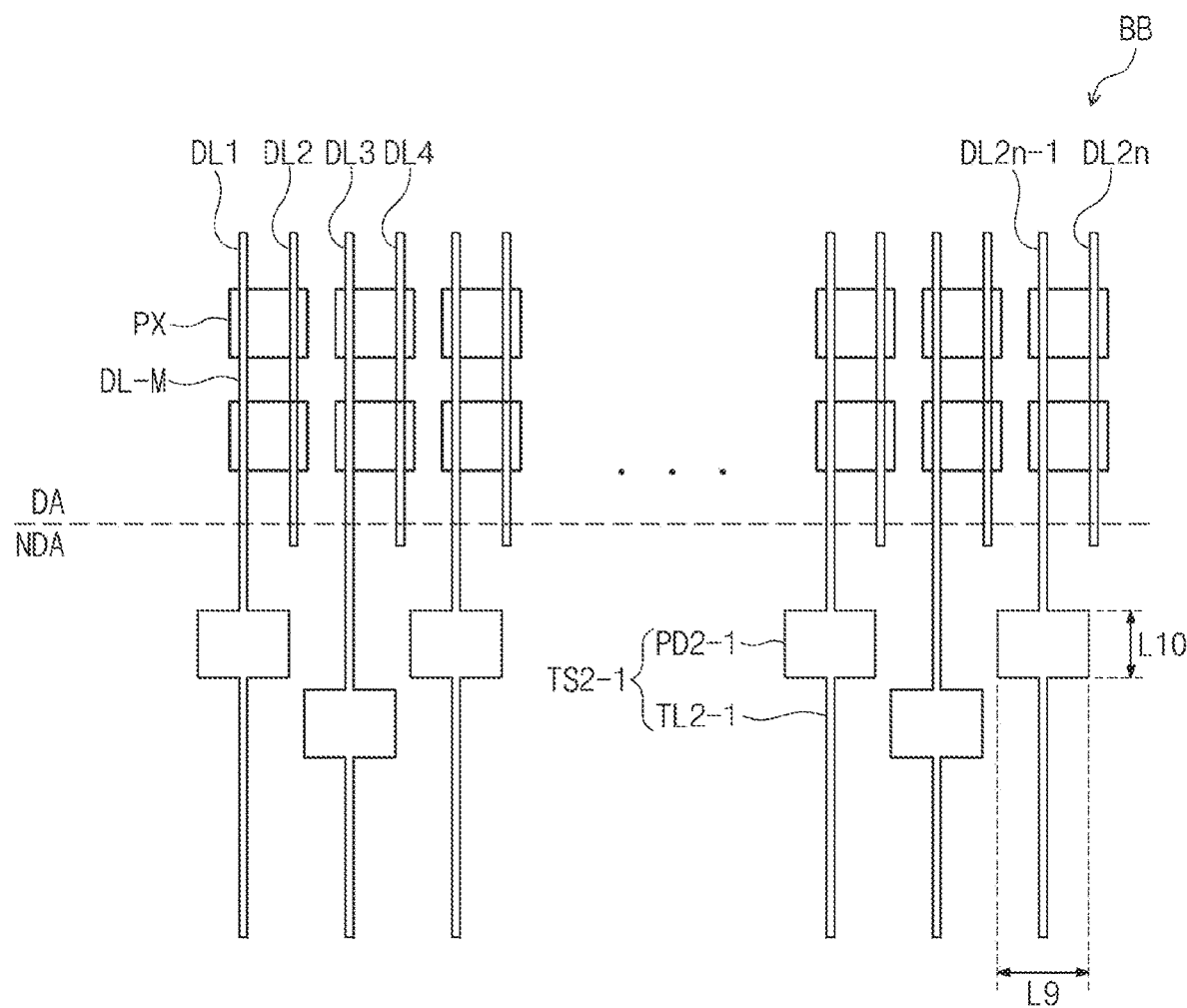
FIGS. 9 to 12 are enlarged views illustrating a portion BB in FIG. 2A or 3A according to some exemplary embodiments.

Referring to FIG. 9, each of second test parts TS2-1 includes a second test line TL2-1 and a second test pad PD2-1. The second test pads PD2-1 are arranged in two rows. In this case, the second test pad PD2-1 may have a transverse length L9 (hereinafter, referred to as a ninth length) and a longitudinal length L10 (hereinafter, referred to as a tenth length) that are greater than the seventh length L7 and the eighth length L8 in FIG. 7. When the ninth length L9 and the tenth length L10 increase, the second inspection equipment may be easier to use.

Figure 10:
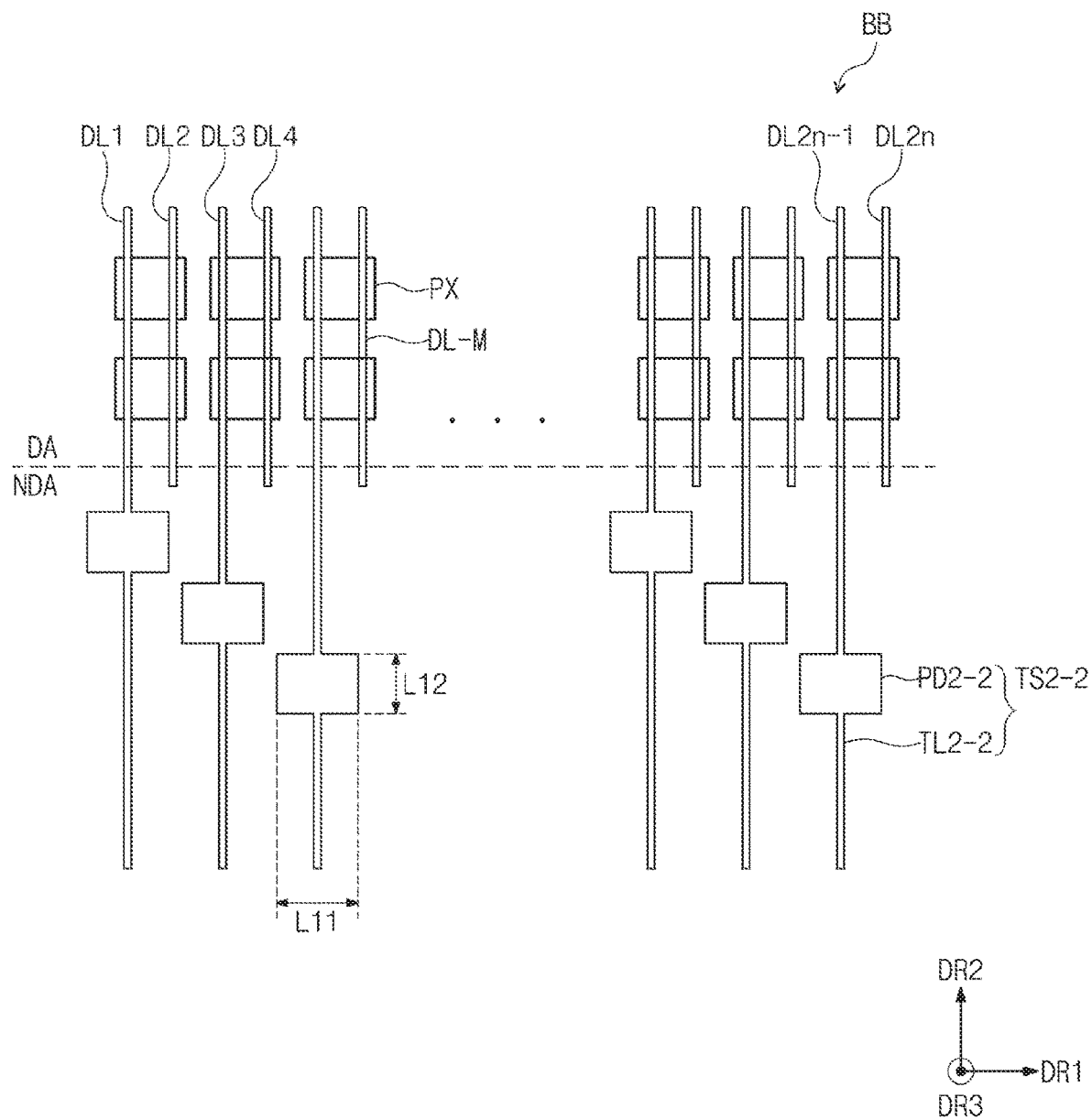

Referring to FIG. 10, each of second test parts TS2-2 includes a second test line TL2-2 and a second test pad PD2-2. The second test pads PD2-2 are arranged in three rows. In this case, the second test pad PD2-2 may have a transverse length L11 (hereinafter, referred to as an eleventh length) and a longitudinal length L12 (hereinafter, referred to as a twelfth length) that are greater than each of the seventh to tenth lengths L7 to L10 in FIGS. 7 and 9. When the eleventh length L11 and the twelfth length L12 increase, the second inspection equipment may be easier to use.

When each of the second test pads PD2-1 and PD2-2 increases in area, the probe may more exactly contact each of the second test pads PD2-1 and PD2-2.

In some exemplary embodiments, (3k-2)-th (here, "k" is a natural number equal to or greater than 1) main data lines DL-M of the odd-numbered main data lines DL-M may be connected to the second test pads PD2-2 in a first row. Also, (3k-1)-th main data lines DL-M of the odd-numbered main data lines DL-M may be connected to the second test pads PD2-2 in a second row. Also, 3k-th main data lines DL-M of the odd-numbered main data lines DL-M may be connected to the second test pads PD2-2 in a third row. However, exemplary embodiments are not limited thereto. For example, connection relationships between the second test pads PD2-2 and the odd-numbered main data lines DL-M may be varied.

Figure 11:
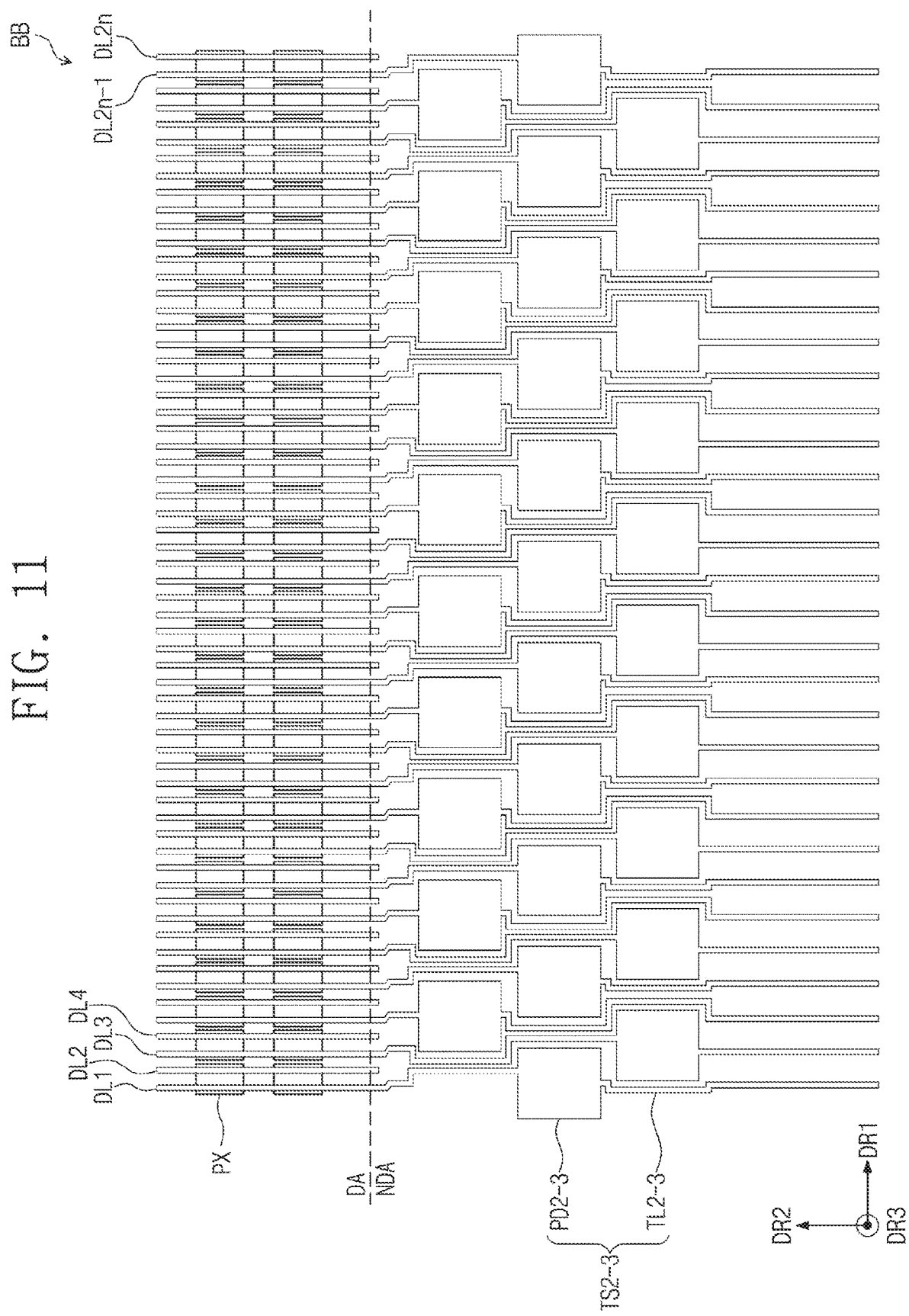

Referring to FIG. 11, second test pads PD2-3 are arranged in three rows as similar to that of FIG. 10. Two lines connected to the second test pads PD2-3 in different rows are disposed between two adjacent second test pads PD2-3 included any one row. For example, a line (e.g., a data line) connected to a second test pad PD2-3 included in the second row and a line (e.g., a data line) connected to a second test pad PD2-3 included in the third row are disposed between two adjacent second test pads PD2-3 included in the first row. The first row is disposed closest to the display area DA, the third row is disposed furthest from the display area DA, and the second row is disposed between the first and third rows. A line (e.g., a second test line) connected to a second test pad PD2-3 included in the first row and a line (e.g., a data line) connected to a second test pad PD2-3 included in the third row are disposed between two adjacent second test pads PD2-3 included in the second row. A line (e.g., a second test line) connected to a second test pad PD2-3 included in the first row and a line (e.g., a test line) connected to a second test pad PD2-3 included in the second row are disposed between two adjacent second test pads PD2-3 included in the third row.

Figure 12:
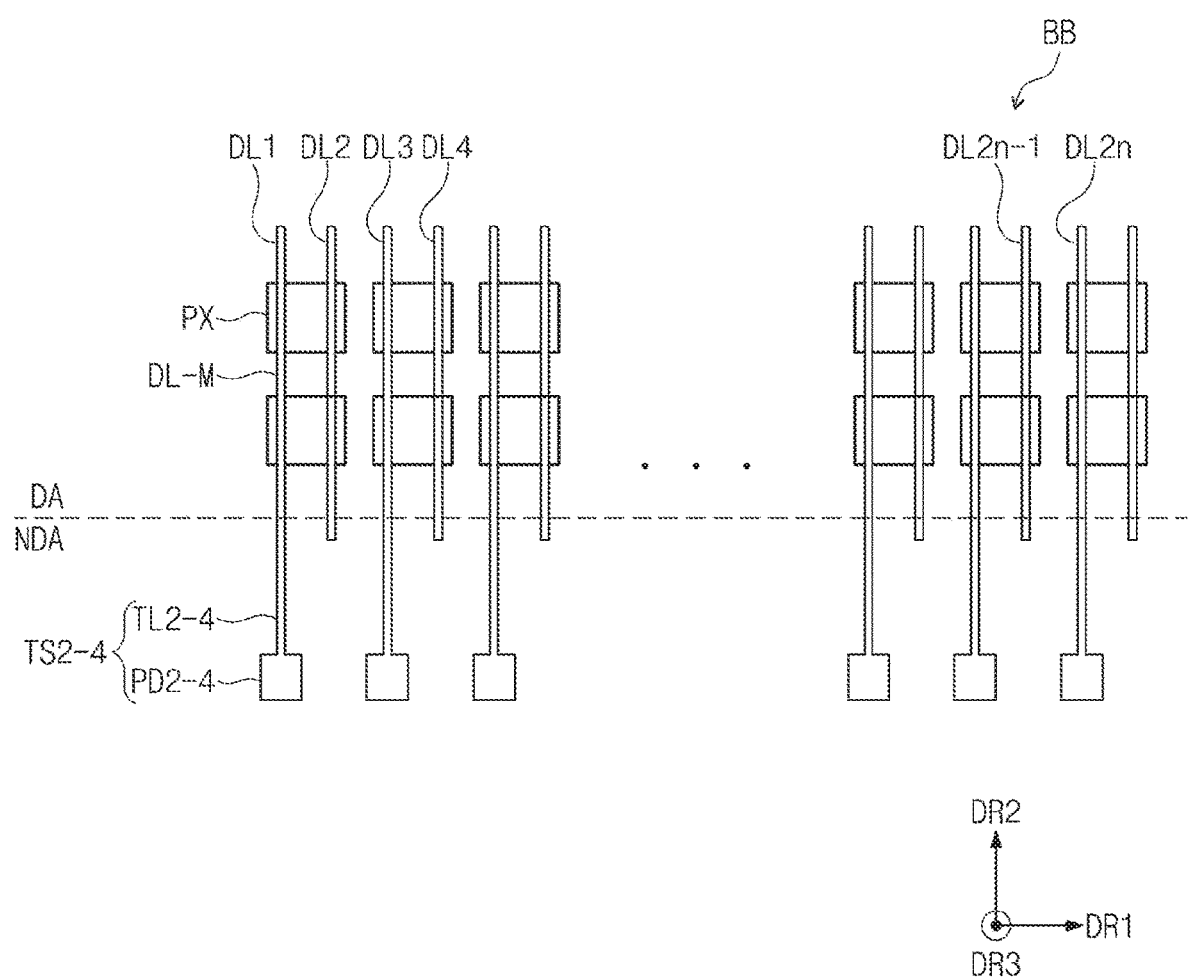

Referring to FIG. 12, each of second test parts TS2-4 includes a second test line TL2-4 and a second test pad PD2-4. The second test lines TL2-4 may be disposed between the second test pads PD2-4 and the pixels PX. Description regarding FIGS. 9 to 12 except for the above description is substantially the same as that described in FIG. 7, and thus, omitted here.

Figure 13:
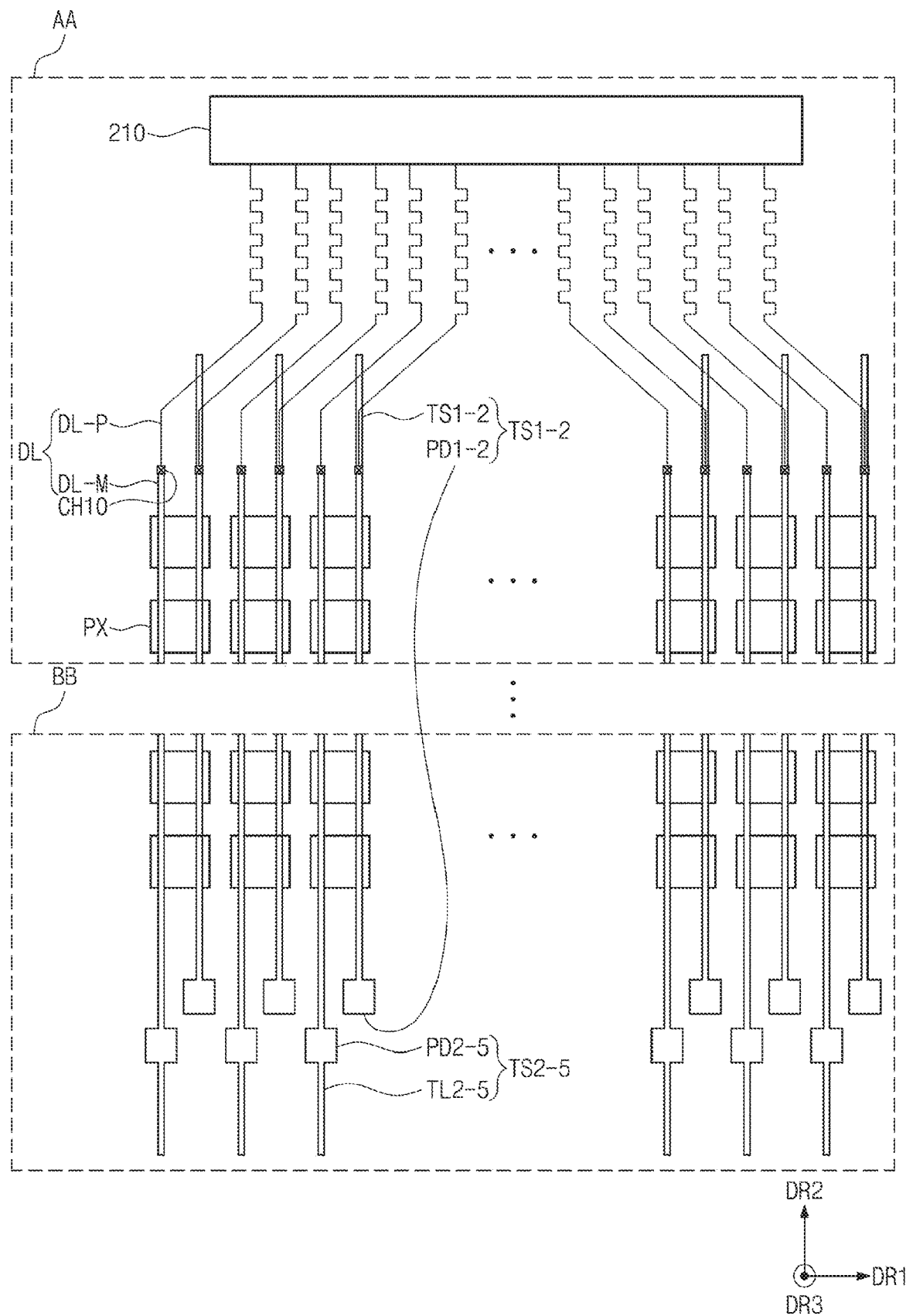
FIG. 13 is an enlarged view illustrating a portion AA and a portion BB in FIG. 2A or 3A according to some exemplary embodiments.
Figure 14:
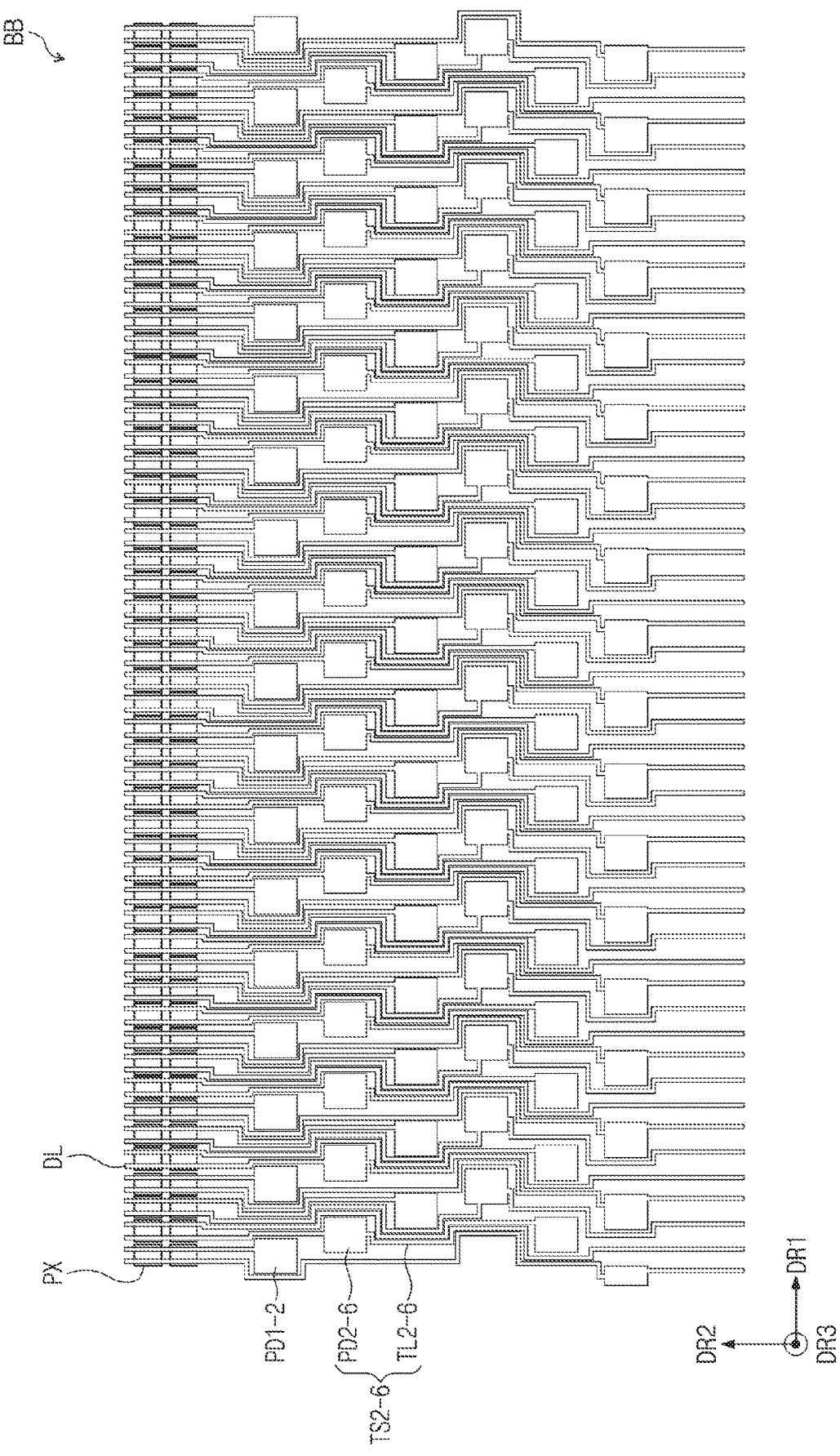
FIG. 14 is a view illustrating a portion corresponding to a portion BB according to some exemplary embodiments.

FIG. 13 is an enlarged view illustrating a portion AA and a portion BB in FIG. 2A or 3A according to some exemplary embodiments. FIG. 14 is a view illustrating a portion corresponding to a portion BB according to some exemplary embodiments.

Referring to FIG. 13, each of first test parts TS1-2 includes a first test line TL1-2 and a first test pad PD1-2. Each of second test parts TS2-5 includes a second test line TL2-5 and a second test pad PD2-5.

The first test lines TL1-2 extend from one end of each of the main data lines DL-M and are disposed between the pixels PX and the data driver 210. The first test pads PD1-2 extend from the other end of each of the main data lines DL-M, unlike other exemplary embodiments previously described. In some exemplary embodiments, the first test pads PD1-2 may be disposed on a row different from that of the second test pads PD2-5. However, exemplary embodiments are not limited to the arrangement of the first test pads PD1-2 and the second test pads PD2-5.

Referring to FIG. 14, the first test pads PD1-2 may be arranged in a plurality of first pad rows, and the second test pads PD2-6 may be arranged in a plurality of second pad rows. The first pad rows and the second pad rows may be arranged alternately with each other.

Figure 15:
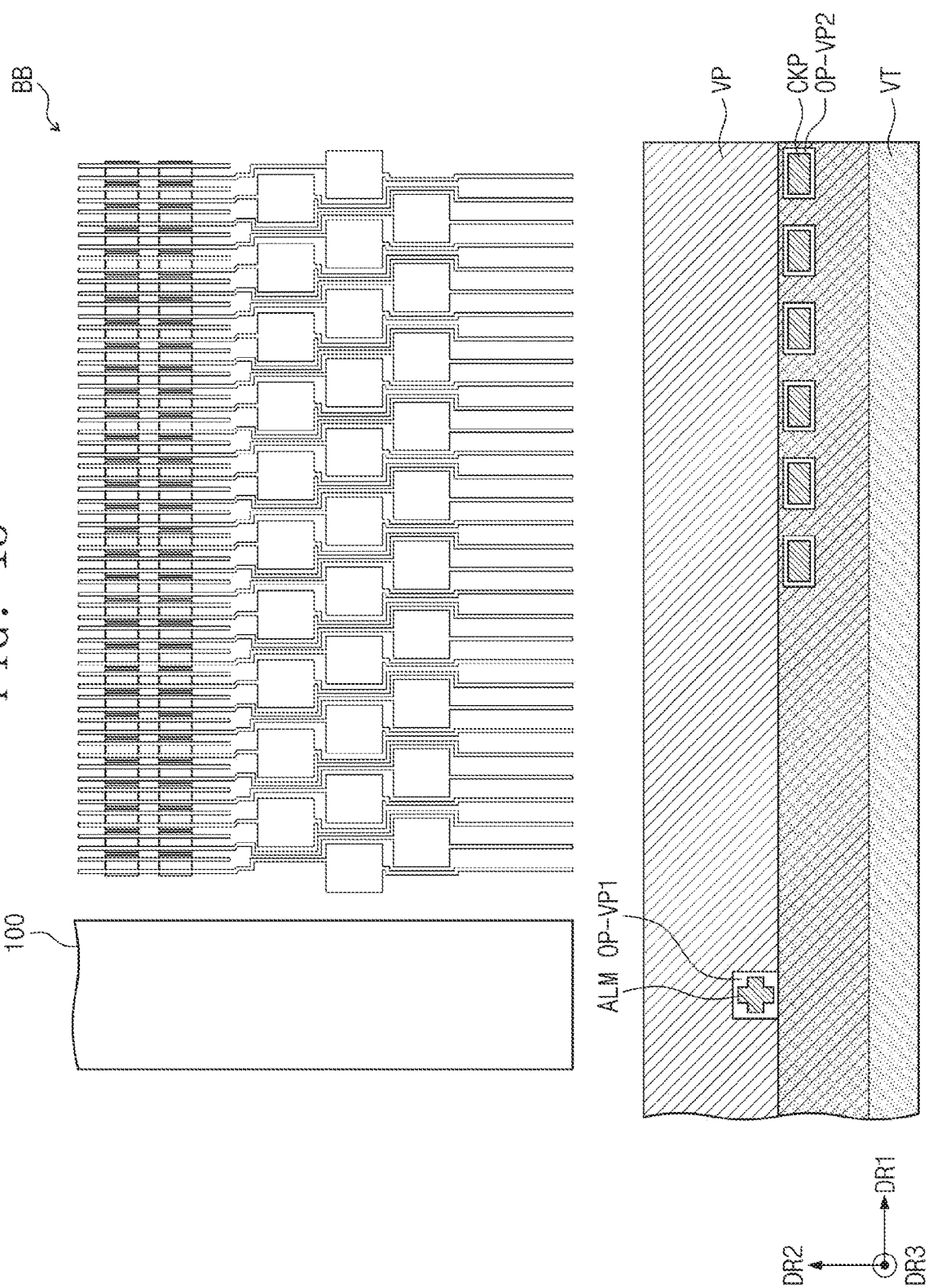
FIG. 15 is a view exemplarily illustrating a portion BB and a peripheral area in FIG. 2A or 3A according to some exemplary embodiments.

FIG. 15 is a view exemplarily illustrating a portion BB and a peripheral area in FIG. 2A or 3A according to some exemplary embodiments. Although the portion BB in FIG. 11 is exemplarily illustrated as the portion BB in FIG. 15, exemplary embodiments of the inventive concept are not limited thereto. For example, the portion BB may be replaced by the portion BB in FIG. 7, 9, 10, 12, 13, or 14.

A common voltage line VP and a connecting electrode VT may be disposed below the portion BB. The common voltage line VP may provide a voltage (e.g., a voltage corresponding to the common voltage and the storage voltage) provided from the outside to the storage line STL of the pixel (refer to FIGS. 2B and 3B).

The connecting electrode VT partially overlaps the common voltage line VP on a plane. The connecting electrode VT may be electrically connected to the common voltage line VP and provide the common voltage Vcom (refer to FIGS. 2B and 3B) provided from the common voltage line VP to the common electrode CE (refer to FIG. 4).

A first opening OP-VP1 and a plurality of openings OP-VP2 may be defined in the common voltage line VP.

An alignment mark ALM may be disposed on (or overlapping with) the first opening OP-VP1. The alignment mark ALM may be disposed below the gate driving circuit 100 and used to implement alignment in most manufacturing processes that are performed after the first substrate DS1 (refer to FIG. 4) is cut.

A check pattern CKP may be disposed on (or overlapping with) each of the second openings OP-VP2. The check pattern CKP is a pattern for checking whether alignment between the common voltage line VP and the connecting electrode VT is properly implemented after the connecting electrode VT is electrically connected to the common voltage line VP.

According to various exemplary embodiments, whether a defect is generated on (or in) data lines of a display panel having high definition may be tested. In particular, an open/short inspection may be performed on the display panel having high definition without applying great variation or replacing existing inspection equipment with new equipment.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a plurality of pixels each comprising a transistor, the transistor comprising an input electrode, an output electrode, and a control electrode disposed in a different layer than the input electrode and the output electrode;
   a plurality of data lines comprising:
      a plurality of main data lines disposed in a same layer as the input electrode and the output electrode; and
      a plurality of fan-out data lines disposed in a same layer as the control electrode, the plurality of fan-out data lines being respectively electrically connected to first ends of the plurality of main data lines through contact holes;
   a data driver electrically connected to the plurality of fan-out data lines and configured to provide a data signal to the plurality of data lines;
   a plurality of first test parts disposed in the same layer as the plurality of main data lines and disposed between the plurality of pixels and the data driver, the plurality of first test parts being electrically connected to one group of data lines among a first group of data lines and a second group of data lines, the first group of data lines comprising odd-numbered data lines among the plurality of data lines, the second group of data lines comprising even-numbered data lines among the plurality of data lines; and
   a plurality of second test parts extending from respective second ends of those main data lines of those data lines of the other group of data lines among the first group of data lines and the second group of data lines,
   wherein the plurality of first test parts comprises:
      a plurality of first test lines overlapping, in a plan view, respective fan-out data lines of the plurality of fan-out data lines; and
      a plurality of first test pads respectively extending from the plurality of first test lines, and
   wherein the second plurality of test parts comprises:
      a plurality of second test lines; and
      a plurality of second test pads respectively extending from the plurality of second test lines.

2. The display device of claim 1, wherein the plurality of second test pads are disposed between the plurality of second test lines and the plurality of data lines.

3. The display device of claim 1, wherein the plurality of second test lines are disposed between the plurality of second test pads and the plurality of data lines.

4. The display device of claim 1, wherein:
   the plurality of first test pads are arranged in one row; and
   the plurality of second test pads are arranged in a plurality of rows.

5. The display device of claim 4, wherein:
   the plurality of second test pads are arranged in three rows;
   each (3k-2)-th ("k" being a natural number greater than or equal to 1) main data line of those data lines of the other group is respectively connected to a second test pad in a first row among the plurality of second test pads;
   each (3k-1)-th main data line of those data lines of the other group is respectively connected to a second test pad in a second row among the plurality of second test pads; and
   each 3k-th main data line of those data lines of the other group is respectively connected to a second test pad in a third row among the plurality of second test pads.

6. The display device of claim 1-2, wherein:
   the plurality of pixels are arranged in a plurality of columns; and
   those pixels in one column among the plurality of columns and arranged in odd-numbered positions are electrically connected to a first data line among the plurality of data lines; and
   those pixels in the one column and arranged in even-numbered positions are electrically connected to a second data line among the plurality of data lines, the second data line being adjacent to the first data line.

7. The display device of claim 6, further comprising:
   a plurality of gate lines configured to provide gate signals to the plurality of pixels,
   wherein each of the plurality of gate lines is connected to one of those pixels arranged in the odd-numbered positions and one of those pixels arranged in the even-numbered positions.

8. The display device of claim 1, wherein each of a distance between two adjacent first test lines among the plurality of first test lines and a distance between two adjacent second test lines among the plurality of second test lines is greater than or equal to about 50 μm and less than or equal to about 100 μm.

9. The display device of claim 8, wherein each of the plurality of first test lines and each of the plurality of second test lines has a length greater than or equal to about 300 μm and less than or equal to about 500 μm.

10. The display device of claim 1, further comprising:
    a plurality of third test parts extending from respective second ends of those main data lines of those data lines of the first group, the plurality of third test parts comprising a plurality of first test pads.

11. The display device of claim 10, wherein the plurality of first test pads are arranged in a different row from the plurality of second test pads.

12. The display device of claim 1, wherein:
    the data driver is one of a plurality of data drivers; and
    the plurality of data drivers is disposed adjacent to only one side of the plurality of first test parts.

13. A display device comprising:
    a plurality of pixels each comprising a transistor, the transistor comprising an input electrode, an output electrode, and a control electrode disposed in a different layer than the input electrode and the output electrode;
    a plurality of data lines comprising:

a plurality of main data lines disposed in a same layer as the input electrode and the output electrode; and a plurality of fan-out data lines disposed in a same layer as the control electrode, the plurality of fan-out data lines being respectively electrically connected to first ends of the plurality of main data lines through contact holes;

a data driver electrically connected to the plurality of fan-out data lines and configured to provide a data signal to the plurality of data lines;

a plurality of first test lines disposed in the same layer as the plurality of main data lines and overlapping, in a plan view, respective fan-out data lines of the plurality of fan-out data lines, the plurality of first test lines being electrically connected to a first group of data lines among the plurality of data lines;

a plurality of first test pads respectively extending from the plurality of first test lines;

a plurality of second test lines extending from respective second ends of those main data lines of a second group of data lines among the plurality of data lines; and a plurality of second test pads respectively extending from the plurality of second test lines.

* * * * *